(12) United States Patent
Oldenburg et al.

(10) Patent No.: US 8,022,711 B2
(45) Date of Patent: Sep. 20, 2011

(54) WIRE FAULT LOCATING IN DISTRIBUTED POWER SYSTEMS

(75) Inventors: Wayne H. Oldenburg, Roscoe, IL (US); Donald G. Kilroy, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 309 days.

(21) Appl. No.: 12/337,356

(22) Filed: Dec. 17, 2008

(65) Prior Publication Data
US 2010/0148791 A1 Jun. 17, 2010

(51) Int. Cl.
G01R 31/08 (2006.01)
G01R 31/11 (2006.01)
(52) U.S. Cl. .................. 324/523; 324/533; 324/534
(58) Field of Classification Search .............. 324/512, 324/523, 527, 528, 532–535
See application file for complete search history.

(56) References Cited

U.S. PATENT DOCUMENTS

| | | | |
|---|---|---|---|
| 6,943,558 B2 * | 9/2005 | Hale et al. | 324/536 |
| 6,954,076 B2 * | 10/2005 | Teich | 324/533 |
| 7,005,995 B2 * | 2/2006 | Hornsby et al. | 324/522 |
| 7,069,163 B2 | 6/2006 | Gunther et al. | |
| 7,075,309 B2 | 7/2006 | Smith | |
| 7,215,126 B2 | 5/2007 | Furse et al. | |
| 7,236,338 B2 * | 6/2007 | Hale et al. | 361/42 |
| 7,271,596 B2 | 9/2007 | Furse et al. | |
| 7,282,922 B2 | 10/2007 | Lo et al. | |
| 2004/0015311 A1 | 1/2004 | Furse et al. | |
| 2005/0057869 A1 | 3/2005 | Hale et al. | |
| 2006/0061368 A1 | 3/2006 | Furse et al. | |
| 2007/0133134 A1 | 6/2007 | Kilroy et al. | |
| 2007/0133135 A1 * | 6/2007 | Kilroy et al. | 361/42 |

FOREIGN PATENT DOCUMENTS
WO 2006102419 A2 9/2006

OTHER PUBLICATIONS

Official European Search Report in counterpart foreign Application No. EP 09252820 filed Dec. 17, 2009.
Lo et al., "Noise-Domain Reflectometry for Locating Wiring Faults", IEEE Transactions on Electromagnetic Compatibility, vol. 47, No. 1, Feb. 2005, 97-104.
Furse et al., "Feasibility of Spread Spectrum Sensors for Location of Arcs on Live Wires", IEEE Sensors Journal, vol. 5, No. 6, Dec. 2005, 1445-1450.

* cited by examiner

Primary Examiner — Timothy J Dole
(74) Attorney, Agent, or Firm — Kinney & Lange, P.A.

(57) ABSTRACT

An electrical fault locating system for distributing power from an input to a plurality of output channels provides fault detection and locating for each of the plurality of output channels. Each of the plurality of output channels is monitored by a fault detection circuit to detect the presence of an electrical fault. In response to a detected fault condition, the fault detection circuit isolates the output channel from the input and generates an output identifying the output channel on which the fault was detected. A fault locating device injects a high-frequency (HF) signal onto the input of the electrical system, the HF signal is distributed to each of the plurality of output channels, and the monitored reflection of the HF signal is monitored by the fault locating device to calculate a distance to the detected fault. The distance calculated by the fault locating device is combined with the channel identification provided by the fault detection circuit to generate a specific location associated with the detected fault.

18 Claims, 1 Drawing Sheet

WIRE FAULT LOCATING IN DISTRIBUTED POWER SYSTEMS

BACKGROUND

The present invention relates to electrical fault protection and, in particular, to a system and method for detecting and locating electrical faults.

Conventional electrical systems distribute electrical power from a power source to one or more of a plurality of loads through a network of switches (contactors, circuit breakers, SSPCs, etc.) wires, terminal blocks, and connectors. Factors such as temperature, moisture, aging and vibration, among others, can result in degradation of one or more components of the electrical system, resulting in electrical faults. In particular, arc faults caused as a result of wire abrasion, loose connectors or screws, or carbon scoring provide a low-impedance path that can result in potentially damaging currents. To prevent damage, newer electrical systems include arc fault detection and protection circuitry. In response to a detected fault, the protection circuitry isolates the line including the fault from the rest of the system, typically by operating a switch (e.g., MOSFET, IGBT) located between the fault and the remainder of the system.

While fault detection and protection circuitry is useful in protecting the electrical system from fault conditions, it does not provide information regarding the location of the fault. This is particularly problematic in aircraft applications in which subsequent inspection of the electrical system may not identify transient faults (i.e., arc faults occurring as a result of in-flight conditions such as vibration). This results in higher maintenance costs as additional time must be spent inspecting an entire feeder line between the opened switch and the connected load, sometimes including several hundred feet of wires and connectors, to locate the fault. In addition, in instances in which the fault cannot be detected, the entire feeder line may have to be replaced, resulting in additional maintenance costs.

As known in the prior art, fault locating devices can be used to detect the location of an electrical fault along a particular line, but these systems are not weight or cost-effective for in flight aircraft applications. In particular, a typical electrical system for an aircraft may include hundreds of individual loads, each of which would require a separate fault locating device. The additional cost and weight of adding individual fault locating devices for each load becomes prohibitive.

SUMMARY

An electrical fault locating system for distributing power from an input to a plurality of output channels provides fault detection and locating for each of the plurality of output channels. The system includes a plurality of solid-state switches, a plurality of fault detection circuits, a fault locating device, and a controller/storage device. Each of the plurality of solid-state switches is connected between each of the plurality of output channels and the input. The state of each solid-state switch determines whether power provided at the input is distributed to a respective output or whether the respective output is isolated from the input. Each of the plurality of fault detection circuits monitors the current provided at each of the plurality of outputs and determines based on the monitored current whether a fault condition exists on the output channel. In response to a detected fault condition, the fault detection circuit controls the respective solid-state switch to isolate the respective output from the input, and generates an identification signal that identifies the output on which the electrical fault was detected. The fault locating device is connected to the input of the system, and injects a high-frequency (HF) coded signal onto the input that is communicated to each of the plurality of outputs. A reflection of the HF signal is monitored by the fault locating device and used to determine the distance to a detected fault. A controller/storage device stores the data gathered by the fault locating device and the identification signal provided by the fault detection circuit identifying the output channel on which the fault occurred.

DETAILED DESCRIPTION

Figure 1:
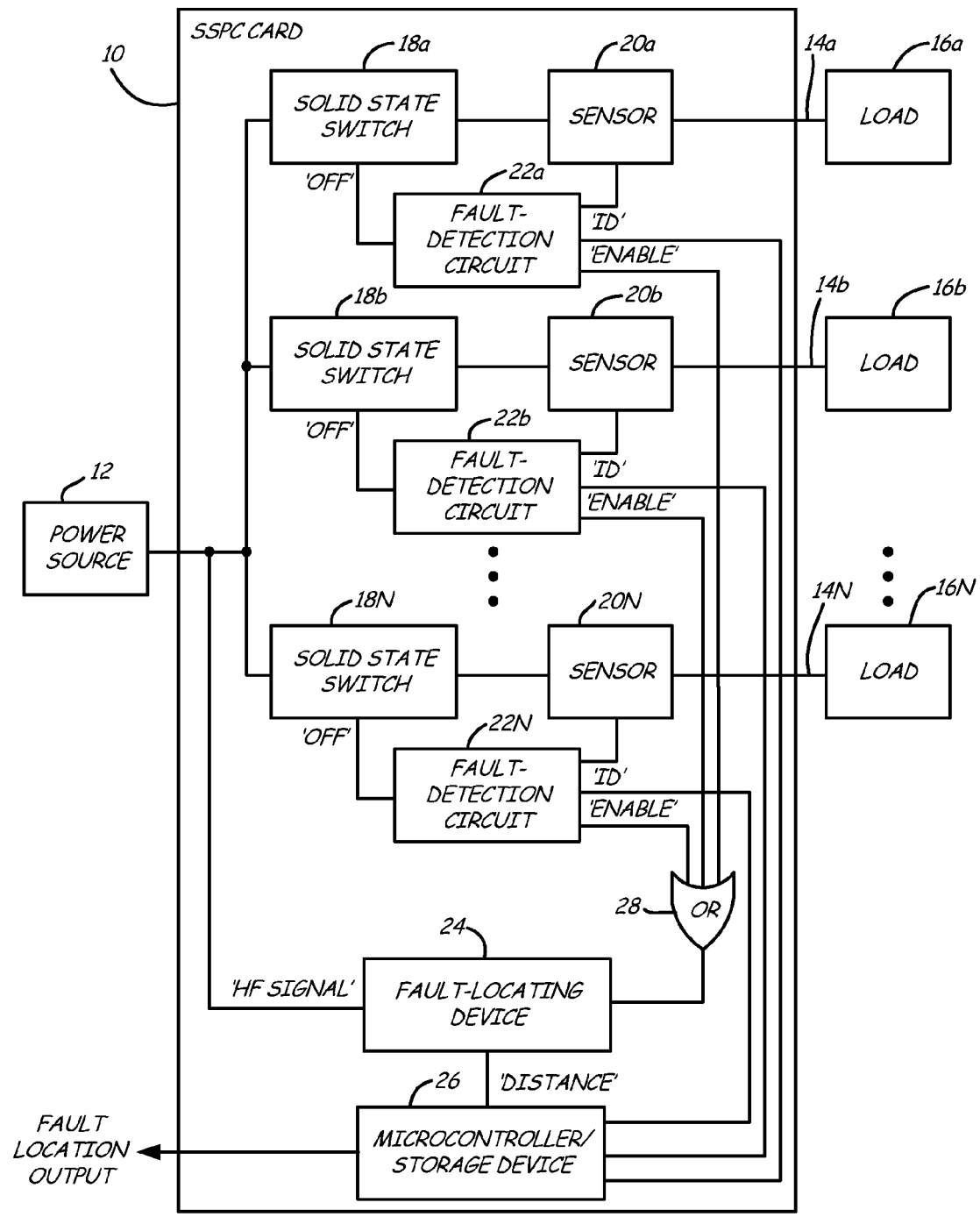
FIG. 1 is a circuit diagram illustrating a fault locating system according to an embodiment of the present invention.

A system and method is provided for detecting and locating electrical faults in distributed electrical systems in which input power is distributed to a plurality of parallel outputs. The architecture of the system provides a low-weight, low-cost solution that is particularly beneficial in aircraft applications in which real-time detection and locating of wiring faults can reduce maintenance costs associated with an aircraft. The system includes a plurality of fault detection circuits, each connected to monitor and detect faults on one of the plurality of parallel output channels, and a fault locating device connected to detect a distance to the detected fault. By combining information provided by the fault detection circuit identifying the output channel on which the fault occurred with distance information provided by the fault locating device, the specific location of the fault can be ascertained. In particular, this topology provides real-time fault locating without the overhead cost associated with including a fault locating device for each output channel.

FIG. 1 is a simplified circuit diagram illustrating solid state power controller (SSPC) switch card 10 with fault detection and location sensing according to an embodiment of the present invention. Power is provided to SSPC card 10 by power source 12, and distributed onto a plurality of output channels 14a, 14b, . . . , 14N (collectively 'output channels 14') to a plurality of individual loads 16a, 16b, . . . , 16N (collectively 'loads 16'). SSPC card 10 includes a plurality of solid-state switches 18a, 18b, . . . 18N (collectively 'solid-state switches 18'), a plurality of sensors 20a, 20b, . . . 20N (collectively 'sensors 20'), a plurality of arc fault detection circuits 22a, 22b, . . . 22N (collectively 'arc fault detection circuits 22'), fault locating device 24 and microcontroller/memory device 26.

SSPC cards are commonly employed on aircraft to selectively distribute power from a source to a plurality of attached loads. In addition, SSPC cards provide convenient means for monitoring each of the plurality of parallel paths and, if necessary, isolating one or more of the paths from the rest of the electrical system based on a detected electrical fault. The present invention further advances the role of SSPC cards to include detecting not only the presence of an electrical fault, but also the location of the detected electrical fault. Implementation of the present invention on a SSPC card is an example of a practical application of the present invention. In other embodiments, the SSPC card may be replaced by other well-known power distribution boards and/or circuits while still implementing the principles and features of the present invention.

In the embodiment shown in FIG. 1, the combination of switches 18, sensors 20, and fault detection circuits 22 provides electrical fault detection and protection. Sensors 20 are connected to monitor the power (e.g., current) provided to a respective load. Fault detection circuits 22 (sometimes referred to as arc fault circuit breakers or arc fault smart cards to distinguish them from typical or dumb circuit breakers that simply open in response to increased current versus time levels) determine based on the monitored current whether an arc fault condition (or other electrical fault condition) has occurred with respect to a particular load 16. Fault detection circuits 22 may include various levels of sophistication. In one embodiment, fault detection by fault detection circuits 22 includes determining, based on the monitored current, whether the monitored current is indicative of a problem without further analysis to determine the type of electrical fault present on the channel. In another embodiment, fault detection by fault detection circuits 22 includes determinations regarding the type of electrical fault present on a respective channel. For example, in one embodiment described in U.S. patent application Ser. No. 11/297,862, titled "AC ARC FAULT DETECTION AND PROTECTION" by Donald G. Kilroy and Wayne H. Oldenburg, incorporated by reference herein, a fault detection circuit is employed to detect the presence of arc faults on an AC feeder line (i.e., output channel). In particular, arc fault detection circuits such as those described in U.S. patent application Ser. No. 11/297,862 employ filtering techniques to extract the arc fault signature from the monitored current waveform, and employ pattern-matching algorithms to distinguish between normal current patterns and arc fault currents. In another embodiment, described in U.S. patent application Ser. No. 11/298,438, titled "DC ARC FAULT DETECTION AND PROTECTION" by Donald G. Kilroy and Wayne H. Oldenburg, incorporated by reference herein, a fault detection circuit is employed to detect the presence of arc faults on a DC feeder line.

In response to a fault condition detected on a particular output channel, the fault detection circuit (e.g., fault detection circuit 22a) provides fault protection by disconnecting the output channel on which the fault occurred (e.g., output channel 14a) from power source 12. In the embodiment shown in FIG. 1, fault protection circuits 22 provide an 'OFF' signal to a respective solid-state switch (e.g., solid-state switch 18a) to place the respective switch in an 'OFF' state, thereby preventing the distribution of power to the output channel. In another embodiment, the functions performed by the fault detection circuit (e.g., fault detection circuit 22a) and the respective solid-state switch (e.g., solid-state switch 18a) are combined into a single device capable of detecting the presence of faults on the output channel and electrically isolating the output channel from power source 12.

In addition to fault protection, each fault detection circuit 22 provides an output identifying the output channel on which the fault occurred. In the embodiment shown in FIG. 1, an identification output (labeled 'ID') is provided by fault detection circuit 22 to micro-controller/storage device 26. The 'ID' output provided by each of the plurality of fault detection circuits 22 may be communicated as individual inputs to microcontroller 26 (as shown in FIG. 1) or may be communicated via a communication bus to microcontroller 26. In addition to information regarding the output channel on which a fault condition has occurred, the output 'ID' may additionally include information, if available from fault detection circuits 22, regarding the type of electrical fault detected (e.g., series-type arc fault, parallel-type arc fault, etc.). Additional information that may be useful in diagnosing the fault condition may also be provided, if available, by fault detection circuits 22.

Information provided by fault detection circuits 22 identifies the output channel on which the fault occurred, but does not identify the location of the fault along the output channel. In some applications, the output channel (i.e., feeder lines) may extend more than a hundred feet. Without information regarding the location of the fault along the output channel, repair of the fault condition requires an inspection of the entire output channel. Fault locating device 24 fills this void, providing information regarding the distance to a detected fault. Combined with information provided by fault detection circuits 22 regarding the output channel on which the fault occurs, the specific location of a detected fault can be determined.

Fault locating device 24 calculates the distance to a detected fault by injecting a high-frequency (HF) signal or coded bit pattern onto the input bus. The injected signal propagates through each of the plurality of parallel paths. Locating device 24 monitors the reflection of the injected signal to determine the distance to a detected fault. Fault locating device 24 may be implemented using any of a plurality of fault location methodologies, including but not limited to standing-wave reflectometry, time-domain reflectometry, frequency-domain reflectometry, spectral time-domain reflectometry, and spread-spectrum reflectometry.

Fault locating device 24 provides the calculated distance to the detected fault as an output to microcontroller/storage device 26. In one embodiment, fault locating device 24 simply monitors the reflected signal and provides an output to microcontroller/storage device 26 representing the reflected signal, without any of the post-processing or analysis required to generate a distance estimate to the detected fault. Post-processing to determine the distance to the detected fault may be performed by controller/storage device 26 or may be stored (along with identification data identifying the channel on which the fault occurred) and processed by an off-board microprocessor to determine the distance to the detected fault. In other embodiments, fault locating device 24 includes sufficient processing power and programming to determine a distance to the detected fault. In addition to providing information regarding the distance to a detected fault, analysis of the reflected signal can be used to identify the type of fault encountered (e.g., open-circuit, short-circuit, etc.). In embodiments in which fault locating device 24 is able to determine based on analysis of the reflected signal the type of fault encountered, fault detection circuits 22 may be less sophisticated. That is, fault detection circuits 22 may be responsible for detecting activity on the output channel indicative of a fault condition and identifying the output channel on which the fault occurs, but will leave analysis regarding the type of fault detected to fault locating device 24. In this way, fault detection circuits 22, a plurality of which are required to monitor the plurality of outputs, may be implemented with less expensive, less sophisticated devices. In other embodiments, the responsibilities associated with detecting the type of fault located may be split between fault detection circuits 22 and fault locating device 24 depending on the relatively strengths and weaknesses of each in detecting and identifying the type of fault.

Fault locating device 24 may operate in either a continuously-enabled mode or a selectively-enabled mode. In the continuously-enabled embodiment, fault location device 24 continuously injects a HF signal onto the input bus and monitors the reflected response, regardless of any outputs generated by fault detection circuits 22. A benefit of this topology (as with other topologies provided by the present invention) is that only a single fault locating device 24 is required to detect fault locations on the plurality of output channels 14, significantly reducing the cost, weight, and power consumption over prior art systems that employ individual fault locating devices for each of the plurality of output channels. However, continuous operation of fault locating device 24 consumes a significant portion of the total power made available to SSPC 10.

In the embodiment shown in FIG. 1, power consumption is reduced by selectively enabling fault locating device 24. In this embodiment, each fault locating device 24 generates an enable signal that is provided through OR gate 28 (or equivalent circuit) to the enable pin of fault locating device 24. In this way, an 'enable' signal provided by any one of the plurality of fault detection circuits 22 enables fault locating device 24, allowing fault locating device 24 to inject the HF signal onto the input bus and monitor the reflected response. When no 'enable' signal is present, fault locating device is effectively disabled or 'OFF', and therefore consumes no or very little power. There are several conditions that may result in the generation of an enable signal by one of the plurality of fault detection circuits 22.

For example, fault locating device 24 is enabled in response to a detected fault condition by one of the plurality of fault detection circuits 22. Once enabled, fault locating device 24 injects a HF signal onto the input, which is propagated onto each of the output channels. The reflected signal is monitored by fault locating device 24 to determine the distance to the detected fault.

In addition, fault locating device 24 may require the storage of a baseline waveform representing 'normal' operating conditions in order to determine the distance to a detected fault. The baseline waveform is generated by injecting the HF signal onto the input during a time in which no faults are known to exist (e.g., at start-up or initialization). The reflected response is stored as the baseline waveform and compared with subsequent reflections monitored during a detected fault condition to calculate the distance to the detected fault. Changes in the switch configuration (i.e., as solid-state switches 18 are selectively controlled to add and/or remove loads) require the baseline waveform to be regenerated. Therefore, fault detection circuits 22 may generate an enable signal in response to a change in state of respective solid-state switch 18. In response to the provided enable signal, fault locating device 24 injects a HF signal and monitors the reflected response, thereby generating the desired baseline waveform. A subsequent fault detected by one of the plurality of fault detection circuits 22 results in another 'enable' signal and subsequent HF injection. The monitored reflection is compared with the stored baseline waveform to determine the distance to the detected fault. The baseline signal may be stored locally by fault locating device 24, replaced each time a new baseline signal is generated, or may be stored by microcontroller/storage device 26. A benefit to the topology illustrated in FIG. 1, in which fault locating device 24 is selectively enabled by fault detection circuits 22, is the conservation of energy otherwise consumed by a continuously-enabled fault locating device 24.

However, embodiments that selectively enable fault locating device 24 in response to a detected fault must ensure that fault locating device 24 has sufficient time to inject the HF frequency signal and receive the reflected signal before a fault detection circuit (e.g., fault detection circuit 22a) turns 'OFF' an associated solid-state switch (e.g., solid-state switch 18a). In one embodiment, 'enable' signals generated by fault detection circuits 22 are staggered with respect to 'OFF' signals provided to solid-state switches 18. For instance, the 'enable' signal provided to fault locating device 24 may be generated in response to a potential fault condition. In AC applications, a detected fault condition (e.g., arc fault) requires several cycles to diagnose. In response to initial cycles indicative of a potential fault condition, an 'enable' signal is provided to fault locating device 24. Subsequent cycles may confirm the presence of a fault such that the respective solid-state switch is turned 'OFF', but the subsequent analysis should allow sufficient time for fault locating device 24 to inject the HF signal and monitor the reflected feedback. In other embodiments, fault detection circuits 22 may employ a timer, either alone or in combination with the above method, to allow a sufficient amount of time between the enabling of fault locating device 24 and the disabling of solid-state switch 18.

Controller/storage device 26 combines the distance information provided by fault locating device 24 with identification information provided by one of the plurality of fault detection circuits 22 experiencing the fault condition to determine the specific location of the detected fault, including both the particular output channel 14 on which the fault occurred and the distance to the detected fault. Although electrical faults of this nature are typically uncommon, controller/storage device 26 may be capable of storing a plurality of data with respect to channels having detected faults and distances calculated with respect to the detected fault.

The specific location of the detected fault (i.e., output on which the fault occurred and distance to the respective fault) is provided as an output by SSPC card 10 (labeled 'Fault Location Output'). In one embodiment, the location of the fault is stored by controller/storage device 26 until subsequently polled by maintenance or connected sub-system. For instance, in aircraft applications, after an aircraft has landed, maintenance crews may interrogate each controller/storage device 26 for the location of detected faults. Based on the provided information, maintenance crews are able to inspect the location of the detected fault and make the necessary repairs without having to perform subsequent operations to locate the detected fault, which as described above may be unsuccessful due to the transient nature of some faults, particularly arc faults. In other embodiments, the output provided by controller/storage device 26 may be immediately communicated off-board (i.e., off the SSPC card) to a microprocessor or higher level controller for subsequent processing, analysis, and/or storage.

Although the present invention has been described with reference to preferred embodiments, workers skilled in the art will recognize that changes may be made in form and detail without departing from the spirit and scope of the invention.

The invention claimed is:

1. An electrical fault locating system comprising:
an input for receiving electrical power;
a plurality of outputs for distributing the electrical power provided at the input;
a plurality of solid-state switches, each connected between the input and one of the plurality of outputs, wherein each of the plurality of solid-state switches is selectively controlled to a first state that connects the input to the respective output or a second state that isolates the input from the respective output;
a plurality of fault-detection circuits, each connected to monitor the electrical current provided to one of the plurality of outputs and to detect, based on the monitored current, the presence of an electrical fault condition on the respective output, wherein in response to a detected electrical fault condition, the respective fault-detection circuit places the respective solid-state switch in the second state to isolate the respective output from the input and generates an identification signal that identifies the output on which the electrical fault was detected;

a fault-locating device for calculating a distance to the electrical fault by injecting a high-frequency (HF) signal at the input of the system that is provided simultaneously to each of the plurality of outputs and monitoring a reflection of the HF signal, wherein the distance to the electrical fault is determined based on the monitored reflection signal; and a controller/storage device for calculating and/or storing a fault location output based on the identification signal identifying the output on which the fault was detected and the distance calculated by the fault-locating device, wherein the fault location output describes a specific location of the detected fault.

2. The system of claim 1, wherein the fault-locating device continuously injects the HF signal at the input of the system.

3. The system of claim 1, wherein the fault-locating device is selectively enabled by one of the plurality of fault detection circuits in response to a detected electrical fault condition.

4. The system of claim 3, wherein the fault-detection circuit device enables the fault locating device, prior to isolating the input from the respective output, to allow the fault-locating device sufficient time to inject and monitor the HF signal.

5. The system of claim 3, wherein the fault locating device is selectively enabled by one of the plurality of fault-detection circuits in response to a respective solid-state switch changing states, wherein the monitored response is stored as a baseline waveform that represents normal operating conditions to which subsequently monitored reflection signals are compared to calculate the distance to a detected fault.

6. The system of claim 5, wherein the baseline waveform is stored locally by the fault locating device.

7. The system of claim 5, wherein the baseline waveform is stored by the controller/storage device and the controller/storage processes the monitored reflection of the HF signal data from the fault locating device to calculate the distance to the detected fault.

8. The system of claim 1, wherein each of the plurality of fault-detection circuits monitors current provided to one of the plurality of outputs and determines based on the monitored current a type of electrical fault present on the respective output.

9. The system of claim 1, wherein the fault locating device determines, based on the reflected signal, a type of electrical fault present on the plurality of outputs.

10. A method of detecting a location of an electrical fault in a distributed electrical system that distributes power from an input to a plurality of outputs, the method comprising:

detecting an electrical fault condition on one of the plurality of outputs by monitoring current provided to each of the outputs, each output being monitored by one of a plurality of fault-detection circuits;

generating, in response to a detected fault condition, an identification signal identifying the output on which the fault occurred;

providing at the input of the distributed electrical system a high-frequency (HF) signal provided by a fault-locating device, wherein the HF signal is distributed simultaneously from the input to each of the plurality of outputs;

monitoring a reflection generated on the input of the distributed electrical system in response to the HF signal;

calculating a distance to the detected fault condition based, at least in part, on the monitored reflection; and combining the calculated distance to the detected fault with the identification of the output on which the fault occurred to generate an output identifying a specific location of the detected fault.

11. The method of claim 10, wherein each of the plurality of fault detection circuits determine a type of electrical fault present on the respective output based on the monitored current.

12. The method of claim 11, wherein the identification signal includes data identifying the type of electrical fault detected by the respective fault detection circuit.

13. The method of claim 10, wherein the fault locating device determines a type of electrical fault present on the plurality of outputs based on the monitored reflection.

14. The method of claim 10, further including:

selectively enabling the fault-locating device in response to a detected fault condition, wherein the fault locating device injects the HF signal only when enabled.

15. The method of claim 14, wherein selectively enabling the fault locating device includes:

selectively enabling the fault-locating device in response to a change in a switch configuration detected by one of the plurality of fault-detection circuits, wherein the monitored reflection stored in response to a change in the switch configuration is a baseline waveform representing normal operating conditions.

16. The method of claim 15, wherein calculating a distance to the detected fault condition includes comparing the monitored reflection with the baseline waveform to determine the distance to the detected fault.

17. An electrical fault locating system comprising:

an input for receiving electrical power;

a plurality of outputs for distributing the electrical power provided at the input;

a plurality of solid-state switches, each connected between the input and one of the plurality of outputs, wherein each of the plurality of solid-state switches is selectively controlled to a first state that connects the input to the respective output or a second state that isolates the input from the respective output;

a plurality of fault-detection circuits, each connected to monitor the electrical current provided to one of the plurality of outputs and to detect, based on the monitored current, the presence of an electrical fault condition on the respective output, wherein in response to a detected electrical fault condition, the respective fault-detection circuit places the respective solid-state switch in the second state to isolate the respective output from the input and generates an identification signal that identifies the output on which the electrical fault was detected;

a fault-locating device for calculating a distance to the electrical fault by injecting a high-frequency (HF) signal at the input of the system that is provided to each of the plurality of outputs and monitoring a reflection of the HF signal, wherein the distance to the electrical fault is determined based on the monitored reflection signal, wherein the fault locating device is selectively enabled by one of the plurality of fault-detection circuits in response to either a respective solid-state switch changing states or a detected electrical fault condition, wherein a monitored response generated in response to a solid-state switch changing states is stored as a baseline waveform that represents normal operating conditions to which subsequently monitored reflection signals are compared to calculate the distance to a detected fault; and a controller/storage device for calculating and/or storing a fault location output based on the identification signal identifying the output on which the fault was detected and the distance calculated by the fault-locating device, wherein the fault location output describes a specific location of the detected fault.

18. A method of detecting a location of an electrical fault in a distributed electrical system that distributes power from an input to a plurality of outputs, the method comprising:
- detecting an electrical fault condition on one of the plurality of outputs by monitoring current provided to each of the outputs, each output being monitored by one of a plurality of fault-detection circuits;
- generating, in response to a detected fault condition, an identification signal identifying the output on which the fault occurred;
- selectively enabling a fault-locating device in response to a detected fault condition, wherein the fault locating device injects a high-frequency (HF) signal only when enabled, wherein the fault-locating device is selectively enabled in response to a change in a switch configuration detected by one of the plurality of fault-detection circuits or in response to a fault condition detected by one of the fault-detection circuits, wherein the fault-locating device stores a monitored reflection of the HF signal injected in response to a change in the switch configuration as a baseline waveform representing normal operating conditions;
- providing at the input of the distributed electrical system the HF signal provided by the fault-locating device, wherein the HF signal is distributed from the input to each of the plurality of outputs;
- monitoring a reflection generated on the input of the distributed electrical system in response to the HF signal;
- calculating a distance to the detected fault condition based, at least in part, on the monitored reflection; and
- combining the calculated distance to the detected fault with the identification of the output on which the fault occurred to generate an output identifying a specific location of the detected fault.

* * * * *